United States Patent
Kwak

(10) Patent No.: US 7,622,376 B2
(45) Date of Patent: Nov. 24, 2009

(54) METHOD FOR MANUFACTURING SEMICONDUCTOR DEVICE USING POLYMER

(75) Inventor: Sung Ho Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 68 days.

(21) Appl. No.: 11/511,392

(22) Filed: Aug. 29, 2006

(65) Prior Publication Data

US 2007/0048988 A1    Mar. 1, 2007

(30) Foreign Application Priority Data

Aug. 29, 2005    (KR) .................. 10-2005-0079300

(51) Int. Cl.
  *H01L 21/3205*    (2006.01)
  *H01L 21/4763*    (2006.01)
(52) U.S. Cl. .................. 438/585; 438/182; 257/717; 257/E21.214
(58) Field of Classification Search .................. 438/182, 438/585; 257/717, E21.214
  See application file for complete search history.

(56) References Cited

U.S. PATENT DOCUMENTS 6,077,733 A * 6/2000 Chen et al. .................. 438/182

6,897,159 B1 * 5/2005 Lee et al. .................. 438/714

OTHER PUBLICATIONS

Kim et al., Study on self-aligned contact oxide etching using C5F8/O2/Ar and C5F8/O2/Ar/CH2F2 plasma, Jun. 27, 2005, J. Vac. Sci. Technol. A 23(4), pp. 953-958.*
Motomura et al., "Surface reaction processes in C4F8 and C5F8 plasmas for selective etching of SiO2 over photo-resist," 2001, Thin Solid Films 390, pp. 134-138.*

* cited by examiner

*Primary Examiner*—Alexander G Ghyka
*Assistant Examiner*—Leonard Chang
(74) *Attorney, Agent, or Firm*—Finnegan, Henderson, Farabow, Garrett & Dunner, L.L.P.

(57) ABSTRACT

A method for manufacturing a semiconductor device using a polymer is provided, wherein a first insulating layer is formed on a substrate, and a first photoresist pattern is formed over the first insulating layer. A polymer is formed around the first photoresist pattern, the polymer having an opening exposing a portion of the first insulating layer, the opening having a predetermined width, the first insulating layer is etched using the polymer as a mask to expose a portion of the substrate, and the first photoresist pattern and the polymer are removed. A gate insulating layer is formed on the exposed portion of the substrate, and a polysilicon layer is formed on the gate insulating layer and the etched first insulating layer. The polysilicon layer is planarized until the first insulating layer is exposed, to form a gate, and the exposed first insulating layer is removed.

20 Claims, 6 Drawing Sheets

METHOD FOR MANUFACTURING SEMICONDUCTOR DEVICE USING POLYMER

RELATED APPLICATION

This application is based upon and claims the benefit of priority to Korean Application No. 10-2005-0079300, filed on Aug. 29, 2005, the entire contents of which are incorporated herein by reference.

BACKGROUND

1. Technical Field

The present invention relates to a method for manufacturing a semiconductor device using a polymer.

2. Description of the Related Art

In semiconductor processing, it is becoming increasingly important to save costs, time, and energy by promoting the miniaturization and high-integration of semiconductor devices. Such miniaturization and integration processes also serve to enhance new functions of the semiconductor device.

In conventional semiconductor device processing, photolithography processes have played the most important role in achieving the miniaturization and high integration of the device. Photolithography technology in accordance with the conventional art may be based on projection-printing using a stepper. In the projection printing, light is projected onto a wafer coated with photoresist through a plurality of lenses, and exposing and patterning only the photoresist on a predetermined portion of the wafer. A resolution (R) of the stepper is defined by optical diffraction according to the Rayleigh Equation. The Rayleigh equation is $R=k1(\lambda/NA)$, where $\lambda$ represents a wavelength of light, NA (Numerical Aperture) is the number of apertures of a lens, and k1 is a constant associated with a photoresist. The theoretical limit by the optical diffraction is generally $NA=D/2f$ (where D represents a diameter of a lens, and f represents a focal length). However, the actual limit is $\lambda$. Consequently, as a wavelength of light gets shorter, a smaller pattern may be implemented on the device. However, the miniaturization of a structure makes it more difficult to manufacture the device, subsequently increasing the manufacturing cost.

To solve those problems, a new semiconductor process, utilizing a non-photolithographic method, is being developed. That is, various technologies including soft X-ray lithography, extreme ultraviolet (EUV) lithography, and electron beam writing are being attempted. However, those technologies are disadvantageous in that significant expenses are needed to obtain a high resolution for achieving a line width of 100 nm or smaller. Besides, those technologies are not eco-friendly since a source being used therein may release radioactivity, and patterning cannot be made on a surface which is not flat.

SUMMARY

Accordingly, the present invention is directed to a method for manufacturing a semiconductor device using a polymer. The method substantially obviates one or more problems due to limitations and disadvantages of the related art.

Embodiments consistent with the present invention provide a method for manufacturing a semiconductor device using a polymer that provides higher resolution than that of a photolithography process.

Additional advantages and features of the invention will be set forth in part in the description which follows and in part will become apparent to those having ordinary skill in the art upon examination of the following or may be learned from practice of the invention. The features and other advantages of the invention may be realized and attained by the structure particularly pointed out in the written description and claims hereof as well as the appended drawings.

Consistent with the present invention, there is provided a method for manufacturing a semiconductor device using a polymer, including: forming a first insulating layer on a substrate; forming a first photoresist pattern over the first insulating layer; forming a polymer around the first photoresist pattern, the polymer having an opening exposing a portion of the first insulating layer, the opening having a predetermined width; etching the first insulating layer using the polymer as a mask to expose a portion of the substrate; removing the first photoresist pattern and the polymer; forming a gate insulating layer on the exposed portion of the substrate; forming a polysilicon layer on the gate insulating layer and the etched first insulating layer; planarizing the polysilicon layer until the etched first insulating layer is exposed, to form a gate; and removing the exposed first insulating layer.

Consistent with embodiments of the present invention, there is provided a method for manufacturing a semiconductor device, including: forming a first insulating layer on a substrate; forming a first photoresist pattern over the first insulating layer, the first photoresist pattern having a first opening; etching the first insulating layer through the first opening to a predetermined depth, using the first photoresist pattern as a mask; forming a polymer around the first photoresist pattern and on the etched first insulating layer, the polymer having a second opening that expose a portion of the etched first insulating layer; etching the first insulating layer exposed through the opening using the polymer as a mask until a portion of the substrate is exposed; removing the polymer and the first photoresist pattern; forming a gate insulating layer on the exposed portion of the substrate; forming a polysilicon layer on the gate insulating layer and the first insulating layer; planarizing the polysilicon layer until the first insulating layer is exposed; forming a second photoresist pattern on the first insulating layer and the planarized polysilicon layer; and etching the polysilicon layer and the first insulating layer using the second photoresist pattern as a mask to form a gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of embodiments consistent with the invention and are incorporated in and constitute a part of this application, illustrate embodiment(s) consistent with the invention and together with the description serve to explain the principle of the invention. In the drawings.

DETAILED DESCRIPTION

Reference will now be made in detail to the embodiments of the present invention, examples of which are illustrated in the accompanying drawings. Wherever possible, the same reference numbers will be used throughout the drawings to refer to the same or like parts.

The method for manufacturing a semiconductor device using a polymer consistent with a first embodiment of the present invention will now be described with reference to FIGS. 1 to 7.

Figure 1:
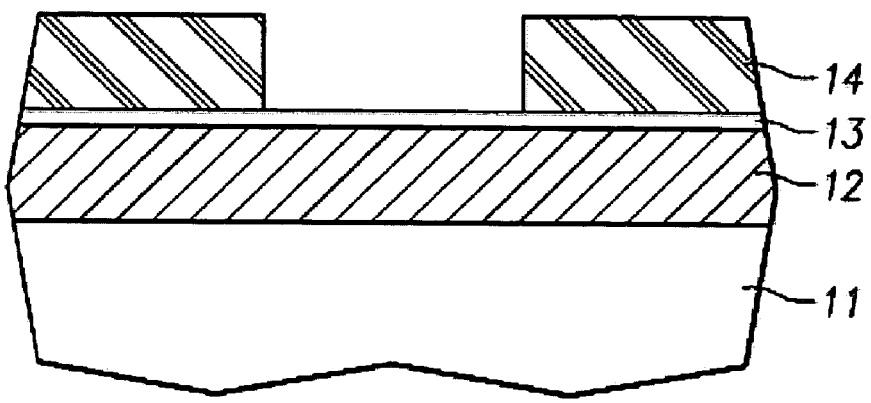
FIGS. 1 to 7 are cross-sectional views sequentially illustrating processes for manufacturing a semiconductor device using a polymer consistent with an embodiment of the present invention.

Referring to FIG. 1, a first insulating layer 12 is formed on a substrate 11. Substrate 11 may be a silicon substrate, and first insulating layer 12 may be an oxide layer or a nitride layer.

Then, an antireflective coating (ARC) 13 is formed on first insulating layer 12, and a first photoresist is applied thereon and is exposed at the highest resolution of an exposure device to form a minimum pattern. Thus, a first photoresist pattern 14 exposing a predetermined portion of antireflective coating 13 is formed.

Figure 2:
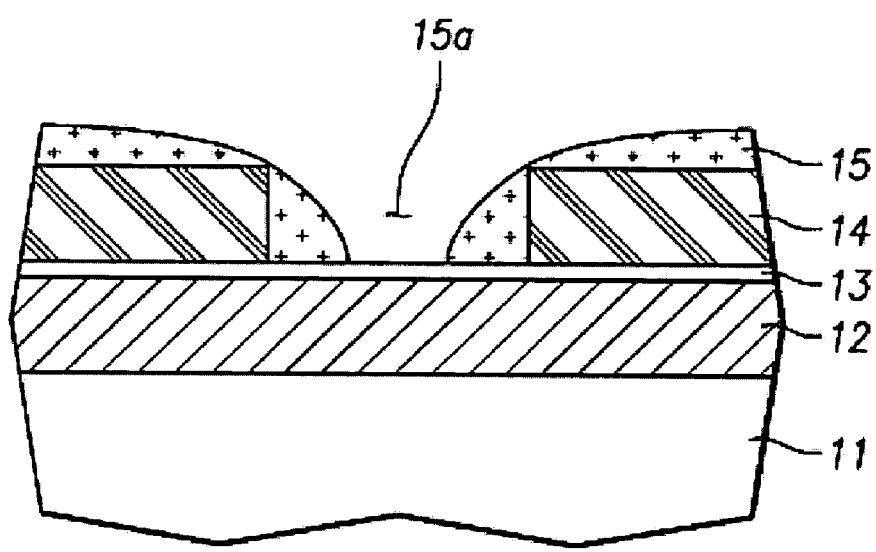

Then, as illustrated in FIG. 2, a polymer 15 is formed on first photoresist pattern 14 and the exposed portion of antireflective coating 13.

Polymer 15 may be formed to have the same base ($C_xH_x$) as that of first photoresist pattern 14 using a mixture gas including carbon (C) by an etching apparatus that is capable of simultaneously depositing and etching polymer 15.

As the etching apparatus simultaneously deposits and etches polymer 15, polymer 15 is formed only around photoresist pattern 14, and a portion of polymer 15 that is formed on a part of the predetermined exposed portion of antireflective coating 13 is etched, so that polymer 15 has an opening exposing a part of the predetermined portion of antireflective coating 13.

The process of forming polymer 15 will now be described in more detail.

A polymer forming gas including a predetermined amount of C—F reacts with first photoresist pattern 14 to generate a C—F polymer, forming a polymer layer around first photoresist pattern 14. The polymer forming gas, however, does not react with the exposed portion of antireflective coating 13, and thus polymer 15 is formed only around photoresist pattern 14 and has an opening exposing a part of the predetermined portion of antireflective coating 13.

In an embodiment consistent with the present invention, $C_5F_8$ may be used as a polymer forming gas. The $C_5F_8$ is a gas with a low fluorine/carbon ratio and easily participates in polymerization reactions.

That is, C of a C—F based gas contributes to forming a polymer and F contributes to etching. Here, a polymer is hardly generated when a gas such as $CF_4$ and $C_2F_8$ having a C/F ratio of 1:4 or greater is used.

In contrast, when, for example, a $C_5F_8$ gas having a C/F ratio of 1:1.6 is used, polymer 15 is easily formed on sidewall portions of first photoresist pattern 14. However, polymer 15 is not formed at the predetermined portion of first insulating layer 12 under the exposed antireflective coating, that is, at the opening 15a.

Consistent with an embodiment of the present invention, $CH_2F_2$, Ar, and $O_2$ may be added to the polymer forming gas.

Such added gases may accelerate the polymer formation. Also, a He gas may be added to improve a profile of the polymer.

Power may be set to about 500~900 W and pressure may be set to about 20~40 mT in forming polymer 15, so that polymer 15 may have an optimum profile.

For example, a polymer having an optimum profile may be formed under conditions of a power of about 700 W and a pressure of about 30 mT, using a polymer forming gas including $C_5F_8$, $CH_2F_2$, Ar, and $O_2$.

Figure 3:
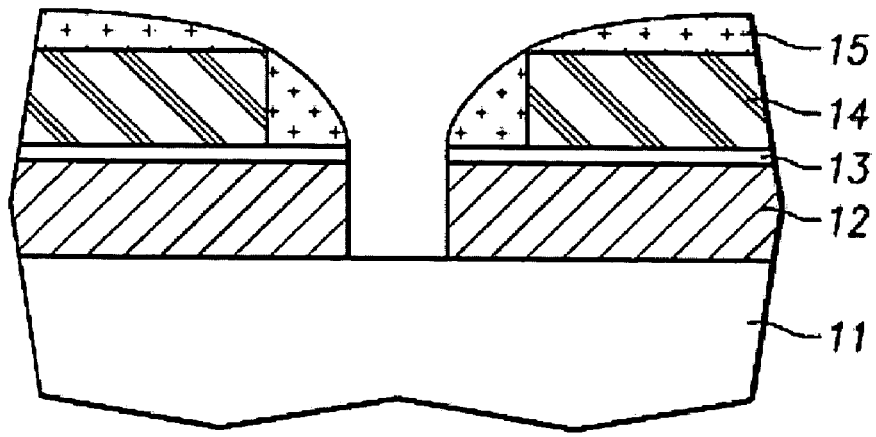

Then, as illustrated in FIG. 3, antireflective coating 13 is etched using polymer 15 as a mask, and first insulating layer 12 is etched until substrate 11 is exposed. As first insulating layer 12 is etched using polymer 15 as a mask, a smaller pattern than a pattern formed at the highest resolution of a photolithography process to form a minimum pattern may be obtained.

Figure 4:
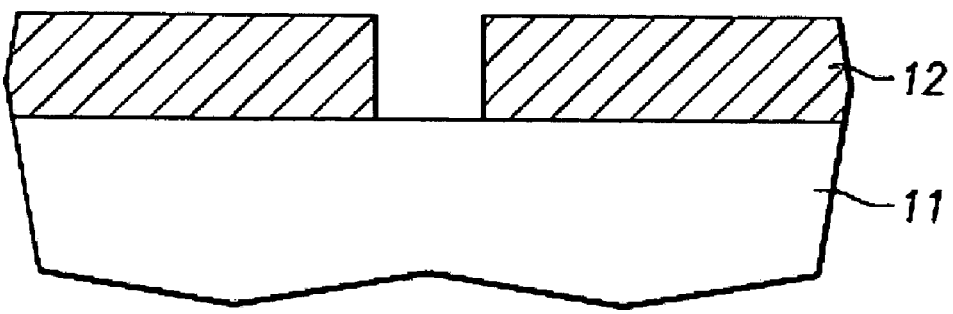

Thereafter, as illustrated in FIG. 4, antireflective coating 13, photoresist pattern 14, and polymer 15 are removed through an ashing process and a photoresist stripping process.

Figure 5:
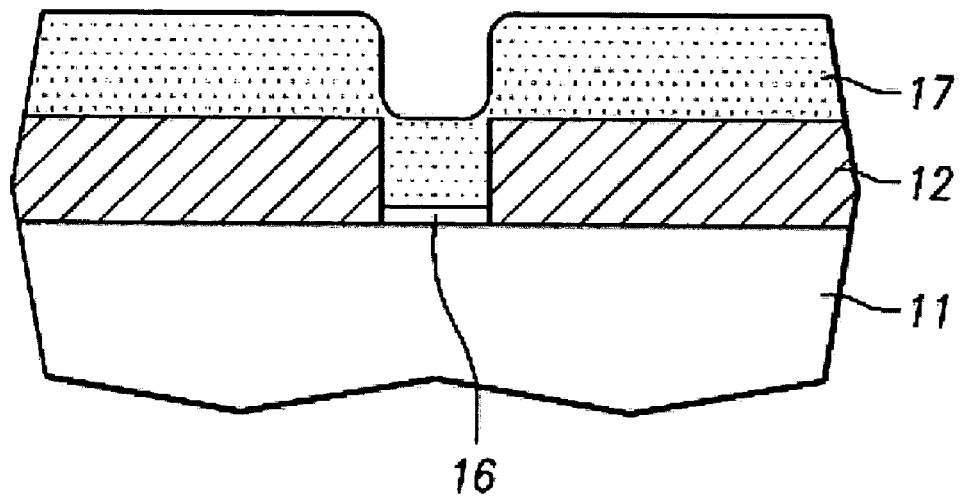

Then, as illustrated in FIG. 5, a gate insulating layer 16 is formed on the exposed portion of substrate 11. Gate insulating layer 16 may be formed by any conventional process. For example, consistent with embodiments of the present invention, gate insulating layer 16 may be formed by a thermal oxidation process. If gate insulating layer 16 is formed by a thermal oxidation process, gate insulating layer 16 is not formed on the first insulating layer 12 but formed only on the exposed portion of substrate 11 through an etched portion of first insulating layer 12.

Thereafter, a polysilicon layer 17 is formed on gate insulating layer 16 and the etched first insulating layer 12.

Figure 6:
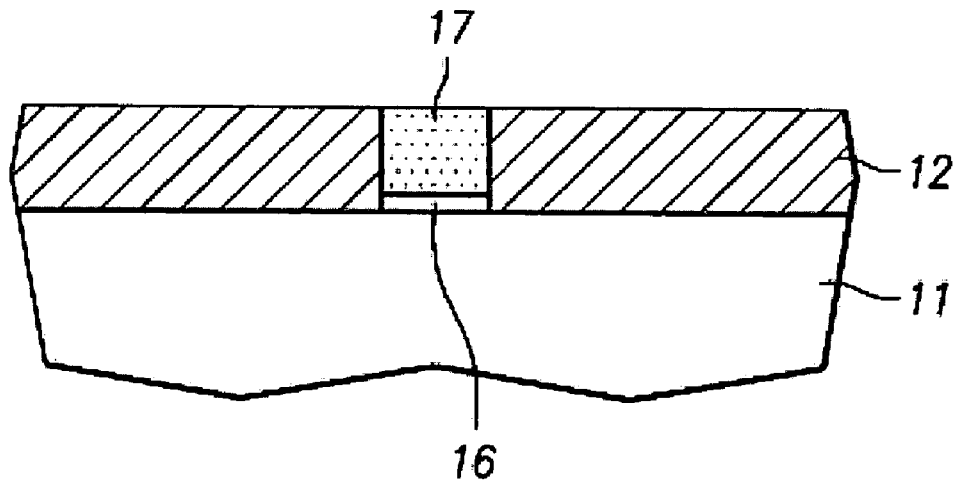

Then, as illustrated in FIG. 6, polysilicon layer 17 is planarized until first insulating layer 12 is exposed. Consistent with an embodiment of the present invention, polysilicon layer 17 may be planarized using a chemical mechanical polishing (CMP) process.

Figure 7:
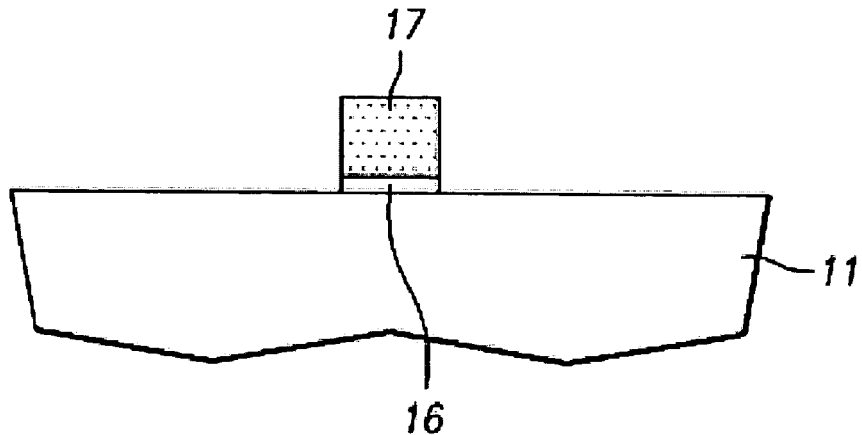

Next, as illustrated in FIG. 7, first insulating layer 12 is removed, thereby completing a gate including polysilicon layer 17 and gate insulating layer 16. First insulating layer 12 may be removed by a wet etching process.

According to the method for manufacturing a semiconductor device using a polymer consistent with a first embodiment of the present invention, gate 17 is formed using a pattern having a smaller width than that of a minimum pattern that the exposure device can form.

Consistent with a second embodiment of the present invention, a gate of a semiconductor device has a wider width at an upper portion than at a lower portion thereof. Here, the same reference numerals are designated to the same elements as those of the first embodiment.

Specifically, in the second embodiment, a first insulating layer 12 is formed on a substrate 11 as described with reference to FIG. 1. First insulating layer 12 may be an oxide layer or a nitride layer. An antireflective coating 13 is formed on substrate 11 including first insulating layer 12, and a photoresist is applied thereon. Then, an exposure device exposes a resulting structure under exposure conditions that can form a minimum pattern, thereby forming first photoresist pattern 14.

Figure 8:
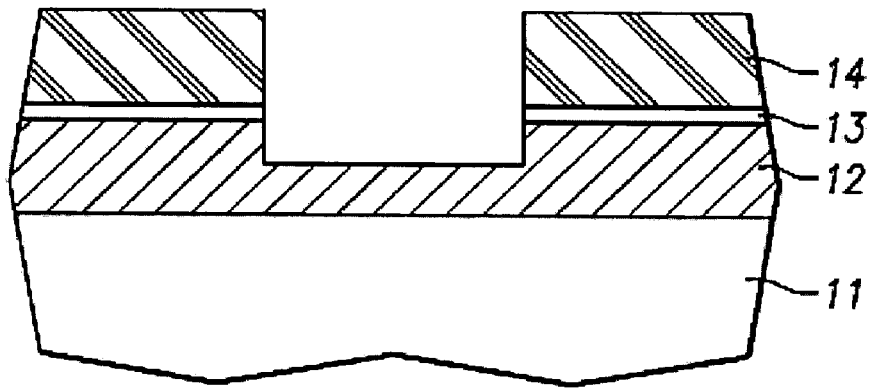
FIGS. 8 to 17 are cross-sectional views sequentially illustrating processes for manufacturing a semiconductor device using a polymer consistent with an embodiment of the present invention.

As illustrated in FIG. 8, a first etching process is performed using first photoresist pattern 14 as a mask to etch antireflective coating 13 and also etch first insulating layer 12 to a predetermined depth.

Figure 9:
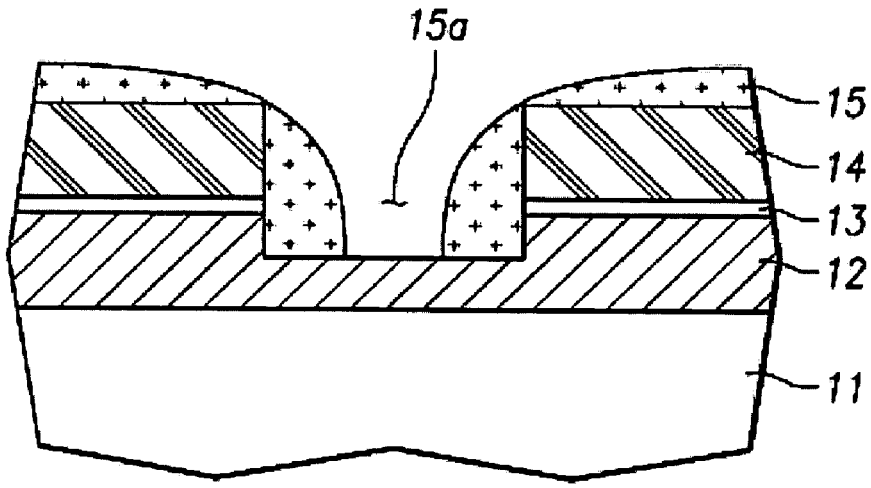

Thereafter, as illustrated FIG. 9, a polymer 15 is formed on first photoresist pattern 14 and the etched first insulating layer 12. Polymer 15 may be a photoresist ($C_xH_x$)-based polymer that is formed by an etching apparatus capable of simultaneously depositing and etching the polymer using a mixture gas including carbon (C) that is capable of generating lots of polymers. As the etching apparatus simultaneously deposits and etches polymer 15, polymer 15 is formed only around photoresist pattern 14 and on a portion of the etched first insulating layer 12, and polymer 15 formed on a part having a predetermined width of the exposed portion of first insulating layer 12 is etched, thereby forming an opening in polymer 15 exposing the part having the predetermined width of first insulating layer 12.

The polymer forming process described above with respect to a first embodiment consistent with the present invention may be used as a polymer forming process of the second embodiment.

Figure 10:
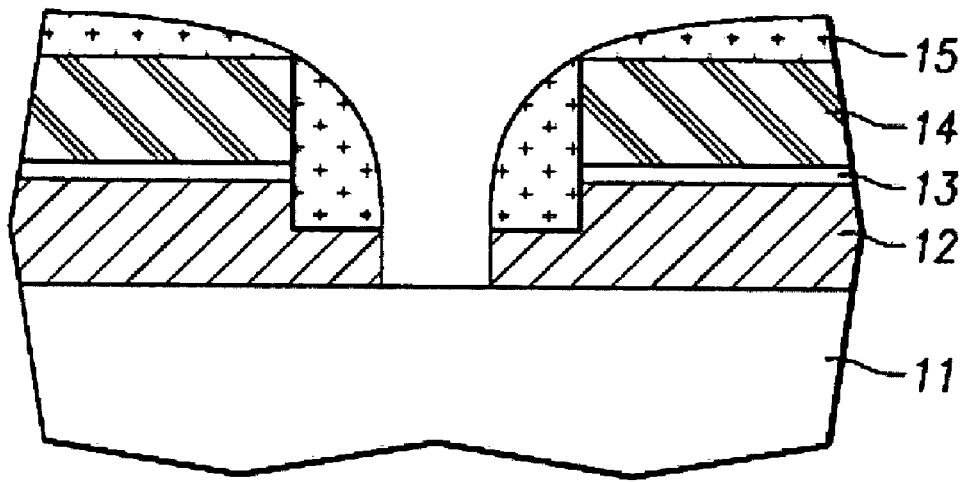

Then, as illustrated FIG. 10, a second etching process is performed on first insulating layer 12 using polymer 15 as a mask until substrate 11 is exposed. Since the etching is performed using polymer 15 as a mask, a smaller pattern than a pattern formed at the highest resolution of a photolithography process of the conventional art to form a minimum pattern may be obtained.

Figure 11:
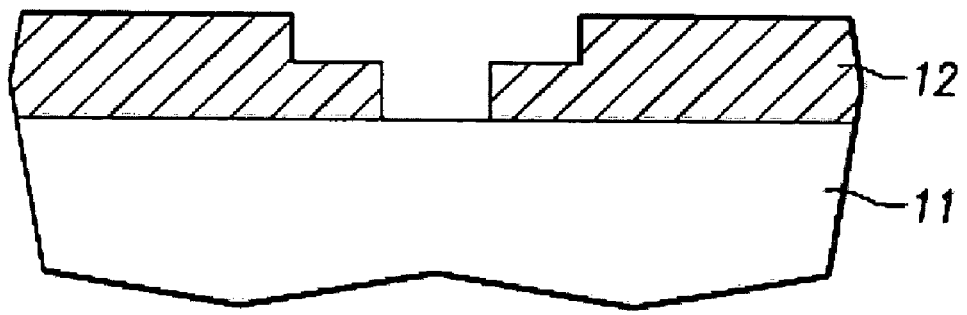

As illustrated in FIG. 11, antireflective coating 13, photoresist pattern 14, and polymer 15 are removed through an ashing process and a photoresist removing process.

Figure 12:
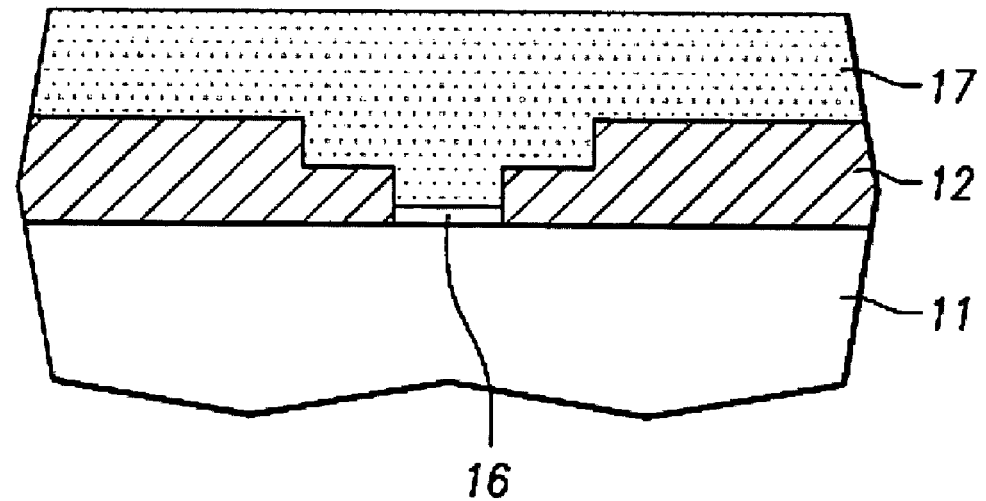

Thereafter, as illustrated in FIG. 12, a gate insulating layer 16 is formed on an exposed portion of substrate 11. Gate insulating layer 16 may be formed by any conventional process, and consistent with embodiments of the present invention, gate insulating layer 16 may be formed by a thermal oxidation process. If gate insulating layer 16 is formed using a thermal oxidation process, gate insulating layer 16 is not formed on first insulating layer 12, but formed only on the exposed portion of substrate 11.

Thereafter, a polysilicon layer 17 is formed on gate insulating layer 16 and first insulating layer 12.

Figure 13:
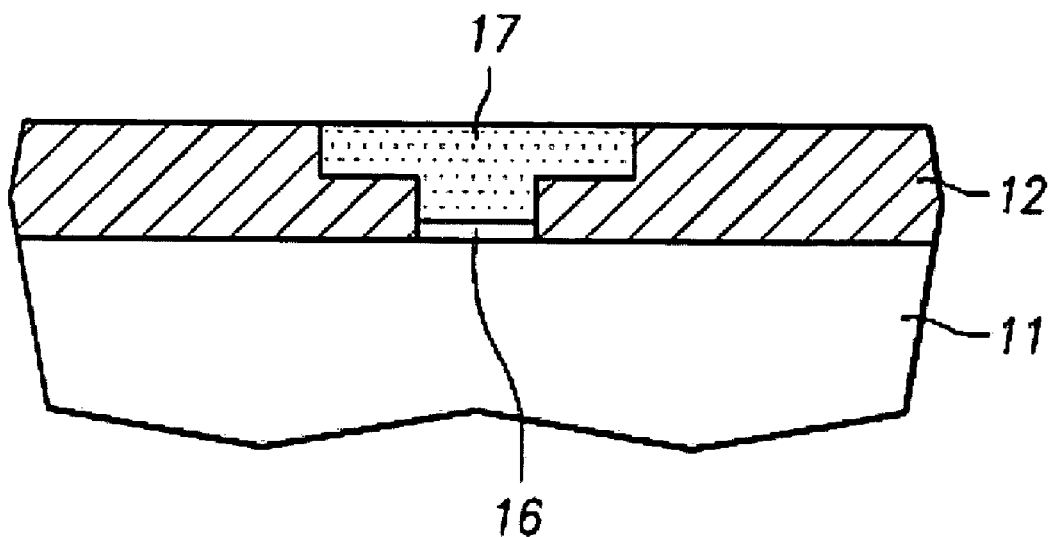

Then, as illustrated in FIG. 13, polysilicon layer 17 is polished and planarized through a chemical mechanical polishing (CMP) process until first insulating layer 12 is exposed.

Figure 14:
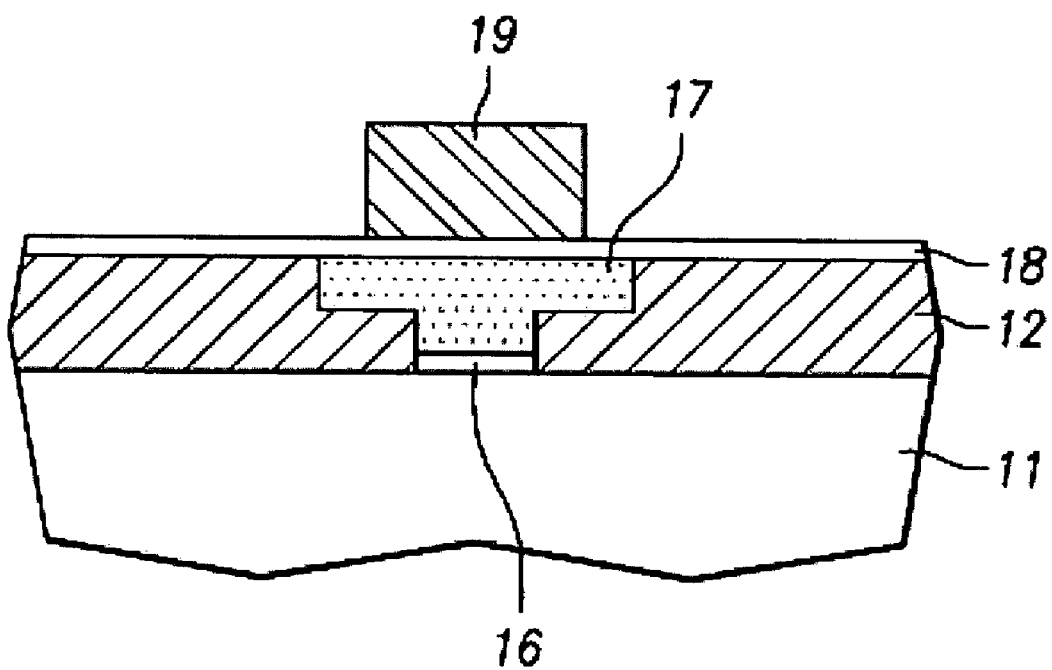

Then, as illustrated in FIG. 14, a photolithography process is performed on substrate 11 to form a second photoresist pattern 19. Specifically, an antireflective coating 18 is formed on substrate 11, a photoresist is applied thereon, and an exposure device performs exposure to form second photoresist pattern 19.

A width of second photoresist pattern 19 is greater than a width of the opening 15a of FIG. 9. The width of second photoresist pattern 19, however, may be smaller than a width of an upper portion of an etched part of first insulating layer 12.

Figure 15:
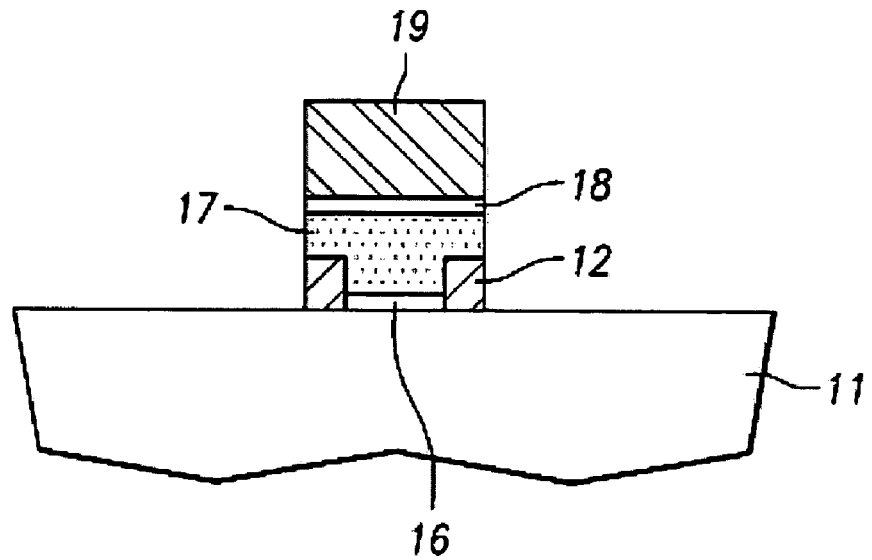

Then, as illustrated in FIG. 15, a third etching process is performed using second photoresist pattern 19 as a mask to etch antireflective coating 18, polysilicon layer 17, and first insulating layer 12 until substrate 11 is exposed.

Figure 16:
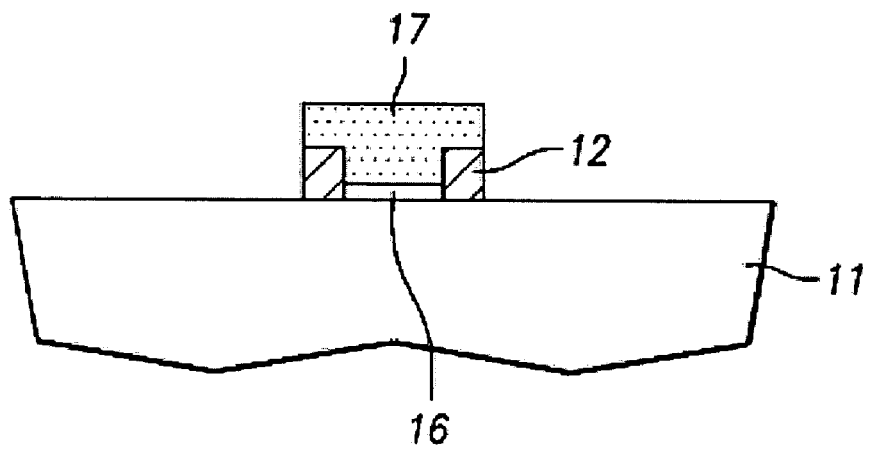

As illustrated in FIG. 16, antireflective coating 18 and second photoresist pattern 19 are removed through an ashing or photoresist removing process. First insulating layer 12 at both sides of a lower portion of polysilicon layer 17 may be used as a spacer. Thus, a T-shaped gate with the spacer, which has a wider width at an upper portion thereof than at a lower portion, is formed. Since the upper portion of the T-shaped gate is wide, a silicide formed on the gate may have a large area to achieve a small resistance.

Figure 17:
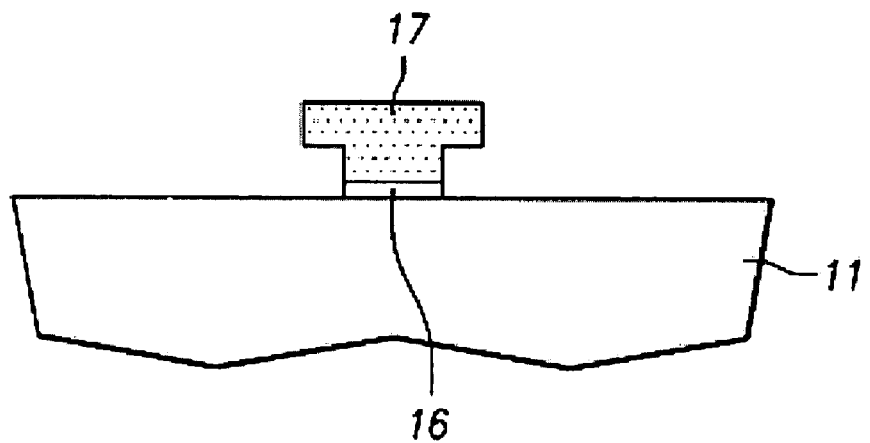

Optionally, as illustrated in FIG. 17, the part of first insulating layer 12 existing at both sides of the lower portion of the polysilicon layer is removed to thereby complete a gate including polysilicon layer 17 and gate insulating layer 16. First insulating layer 12 is removed by wet etching. Consequently, a T-shaped gate without the spacer is formed.

Consistent with embodiments of the present invention, it is possible to form a gate of a semiconductor device at higher resolution using a polymer than that realized by a conventional photolithography process.

Further consistent with embodiments of the present invention, using a polymer in manufacturing a semiconductor device allows a T-shaped gate with a spacer to be formed at a higher resolution than that realized by a conventional photolithography process.

Consistent with the present invention, a gate of a semiconductor device smaller than a minimum gate that can be formed at the highest resolution of a photolithography process may be obtained, using a polymer, instead of using a high resolution photolithography process that costs a lot.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a semiconductor device using a polymer, the method comprising:
    forming a first insulating layer on a substrate;
    forming an antireflective coating layer on the first insulating layer;
    forming a first photoresist pattern over the antireflective coating layer;
    forming a polymer around the first photoresist pattern, the polymer having an opening exposing a portion of the antireflective coating layer, the opening having a predetermined width;
    etching the antireflective coating layer and the first insulating layer using the polymer as a mask to expose a portion of the substrate;
    removing the first photoresist pattern and the polymer;
    forming a gate insulating layer on the exposed portion of substrate;
    forming a polysilicon layer on the gate insulating layer and the etched first insulating layer;
    planarizing the polysilicon layer until the etched first insulating layer is exposed, to form a gate; and
    removing the exposed first insulating layer;
    wherein forming the polymer is performed separately from etching the antireflective coating layer and the first insulating layer.

2. The method according to claim 1, wherein forming the polymer comprises forming a polymer having the same base as that of the first photoresist pattern, the polymer being formed using a mixture gas including carbon (C).

3. The method according to claim 1, wherein forming the polymer comprises simultaneously depositing and etching the polymer using a predetermined etching apparatus.

4. The method according to claim 3, wherein forming the polymer comprises forming the polymer using a C—F based gas to which Ar and $O_2$ gases are added, at a power of about 500~900 W and a pressure of about 20~40 mT.

5. The method according to claim 4, wherein the C—F based gas is one of $C_5F_8$ and $CH_2F_2$, and the polymer is formed at a power of approximately 700 W and a pressure of approximately 30 mT.

6. The method according to claim 1, wherein the gate insulating layer is formed only on the exposed portion of substrate, and is formed by a thermal oxidation process.

7. The method according to claim 1, wherein etching the first insulating layer uses an etching gas different from that used in forming the polymer.

8. The method according to claim 1, wherein the first insulating layer is not etched due to the antireflective coating layer when forming the polymer.

9. A method for manufacturing a semiconductor device, comprising:

forming a first insulating layer on a substrate;

forming an antireflective coating layer on the first insulating layer;

forming a first photoresist pattern over the antireflective coating layer, the first photoresist pattern having a first opening;

etching the antireflective coating layer and the first insulating layer through the first opening to a predetermined depth, using the first photoresist pattern as a mask;

forming a polymer around the first photoresist pattern and on the etched first insulating layer, the polymer having a second opening that exposes a portion of the etched first insulating layer;

etching the first insulating layer exposed through the second opening using the polymer as a mask until a portion of the substrate is exposed;

removing the polymer and the first photoresist pattern;

forming a gate insulating layer on the exposed portion of the substrate;

forming a polysilicon layer on the gate insulating layer and the first insulating layer;

planarizing the polysilicon layer until the first insulating layer is exposed;

forming a second photoresist pattern on the first insulating layer and the planarized polysilicon layer; and etching the polysilicon layer and the first insulating layer using the second photoresist pattern as a mask to form a gate;

wherein forming the polymer is performed separately from etching the first insulating layer exposed through the second opening.

10. The method according to claim 9, wherein forming the polymer comprises forming a polymer having the same base as that of the first photoresist pattern, the polymer being formed using a mixture gas including carbon (C).

11. The method according to claim 9, wherein after etching the polysilicon layer and the first insulating layer to form the gate, two portions of the first insulating layer remain at both sides of the gate, the method further comprising:

removing the two portions of the first insulating layer formed at both sides of the polysilicon layer.

12. The method according to claim 9, wherein the second photoresist pattern has a width greater than a width of the second opening, and is formed to cover the opening.

13. The method according to claim 9, wherein forming the polymer comprises simultaneously depositing and etching the polymer using a predetermined etching apparatus.

14. The method according to claim 13, wherein forming the polymer comprises forming the polymer using a C—F based gas to which Ar and $O_2$ gases are added, at a power of about 500~900 W and a pressure of about 20~40 mT.

15. The method according to claim 14, wherein the C—F based gas is one of $C_5F_8$ and $CH_2F_2$, and the polymer is formed at a power of approximately 700 W and a pressure of approximately 30 mT.

16. The method according to claim 9, wherein the gate insulating layer is formed only on the exposed portion of the substrate, and is formed using a thermal oxidation process.

17. The method according to claim 9, further comprising removing the etched first insulating layer after forming the gate.

18. The method according to claim 9, wherein the second photoresist pattern has a width greater than a width of the second opening, and smaller than a width of the first opening.

19. The method according to claim 9, wherein etching the first insulating layer uses an etching gas different from that used in forming the polymer.

20. The method according to claim 9, wherein the first insulating layer is not etched when forming the polymer.

* * * * *